(12) United States Patent
Xiong

(10) Patent No.: US 11,152,441 B2
(45) Date of Patent: Oct. 19, 2021

(54) ARRAY SUBSTRATE INCLUDING AUXILIARY TRACE LAYER, DISPLAY PANEL, DISPLAY DEVICE AND MANUFACTURING METHOD OF AN ARRAY SUBSTRATE

(71) Applicant: Shanghai Tianma AM-OLED Co., Ltd., Shanghai (CN)

(72) Inventor: Nana Xiong, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 20 days.

(21) Appl. No.: 16/726,963

(22) Filed: Dec. 26, 2019

(65) Prior Publication Data

US 2020/0144336 A1     May 7, 2020

(30) Foreign Application Priority Data

Mar. 29, 2019 (CN) .......................... 201910253147.4

(51) Int. Cl.
    *G09G 3/3233*     (2016.01)
    *H01L 27/32*     (2006.01)
    *H01L 51/56*     (2006.01)

(52) U.S. Cl.
    CPC ......... *H01L 27/326* (2013.01); *G09G 3/3233* (2013.01); *H01L 27/3246* (2013.01); *H01L 27/3248* (2013.01); *H01L 27/3258* (2013.01); *H01L 51/56* (2013.01)

(58) Field of Classification Search
CPC . G09G 3/3233; H01L 27/326; H01L 27/3246; H01L 27/3248; H01L 27/3258; H01L 51/56
See application file for complete search history.

(56) References Cited

U.S. PATENT DOCUMENTS

| | | | |
|---|---|---|---|
| 2013/0314636 A1* | 11/2013 | Chen | .................. H01L 33/0041 349/43 |
| 2017/0373094 A1* | 12/2017 | Park | ..................... H01L 27/3265 |
| 2018/0052552 A1* | 2/2018 | Tsai | ....................... H01L 27/323 |
| 2018/0269268 A1* | 9/2018 | Cai | ..................... H01L 51/5203 |

FOREIGN PATENT DOCUMENTS

CN            107945738 A      4/2018

* cited by examiner

*Primary Examiner* — Lisa S Landis
(74) *Attorney, Agent, or Firm* — Kilpatrick Townsend & Stockton, LLP

(57) ABSTRACT

Disclosed are an array substrate, a display panel, a display device and a manufacturing method of an array substrate. The array substrate includes: a driving array layer, a first insulating layer, an auxiliary trace layer, a second insulating layer and a first electrode layer, which are disposed in sequence. The driving array layer includes multiple thin film transistors. The first insulating layer includes first via holes, and the first electrode layer includes multiple first electrodes. The auxiliary trace layer includes multiple auxiliary traces which correspond to the multiple first electrodes one by one. An auxiliary trace is electrically connected to an electrode of a corresponding thin film transistor through a first via hole. The second insulating layer includes second via holes, and an auxiliary trace is electrically connected to a respective first electrode through a second via hole.

18 Claims, 16 Drawing Sheets

ARRAY SUBSTRATE INCLUDING AUXILIARY TRACE LAYER, DISPLAY PANEL, DISPLAY DEVICE AND MANUFACTURING METHOD OF AN ARRAY SUBSTRATE

CROSS-REFERENCES TO RELATED APPLICATIONS

This application claims the priority to Chinese Patent Application No. 201910253147.4, filed on Mar. 29, 2019, the disclosure of which is incorporated herein by reference in its entirety.

FIELD

Embodiments of the present disclosure relate to the field of display technologies, in particular, to an array substrate, a display panel, a display device, and a manufacturing method of an array substrate.

BACKGROUND

In order to achieve better human-machine interaction, various smart terminals such as mobile phones, tablet computers, smart wearable devices, and information inquiry machines in public halls are equipped with display panels, and the display panels have been widely used.

With continuous development of display technologies, consumers have higher and higher requirements on the quality of the display panels. For example, an Organic Light-Emitting Diode (OLED) display panel has the advantages of wide color gamut, flexibility, and wide viewing angle. Therefore, the display picture of the OLED display panel is more vivid and real. Furthermore, with the increasing maturity of the OLED display panel manufacturing process, the OLED display panel has been more widely used. However, a display panel of the related art still has a problem that the light-emitting area is small and that the aperture ratio is low, which restricts the further improvement of image quality of the display panel.

SUMMARY

The embodiments of the present disclosure provide an array substrate, a display panel, a display device and a manufacturing method of an array substrate to increase a light-emitting area of the display panel and increase an aperture ratio.

One embodiment of the present disclosure provides an array substrate. The array substrate includes: a driving array layer, a first insulating layer, an auxiliary trace layer, a second insulating layer and a first electrode layer, where the driving array layer, the first insulating layer, the auxiliary trace layer, the second insulating layer and the first electrode layer are disposed in sequence.

The driving array layer includes multiple thin film transistors. The first insulating layer includes multiple first via holes. The first electrode layer includes multiple first electrodes.

The auxiliary trace layer includes multiple auxiliary traces, and the multiple auxiliary traces are in one-to-one correspondence with the multiple first electrodes. The multiple auxiliary traces are electrically and correspondingly connected to electrodes of the multiple thin film transistors through the multiple first via holes. The second insulating layer includes multiple second via holes, and the auxiliary trace is electrically connected to a respective first electrode through a second via hole.

One embodiment of the present disclosure further provides a display panel. The display panel includes: an array substrate, a second electrode and multiple light-emitting units disposed between the array substrate and the second electrode.

The array substrate includes a driving array layer, a first insulating layer, an auxiliary trace layer, a second insulating layer and a first electrode layer, and the driving array layer, the first insulating layer, the auxiliary trace layer, the second insulating layer and the first electrode layer are disposed in sequence.

The driving array layer includes multiple thin film transistors. The first insulating layer includes multiple first via holes. The first electrode layer includes multiple first electrodes.

The auxiliary trace layer includes multiple auxiliary traces, and the multiple auxiliary traces are in one-to-one correspondence with the multiple first electrodes. The multiple auxiliary traces are electrically and correspondingly connected to electrodes of the multiple thin film transistors through the multiple first via holes. The second insulating layer includes multiple second via holes, and the auxiliary trace is electrically connected to a respective first electrode through a second via hole.

One embodiment of the present disclosure further provides a display device. The display device includes a display panel.

The display panel includes an array substrate, a second electrode and multiple light-emitting units disposed between the array substrate and the second electrode.

The array substrate includes a driving array layer, a first insulating layer, an auxiliary trace layer, a second insulating layer and a first electrode layer, and the driving array layer, the first insulating layer, the auxiliary trace layer, the second insulating layer and the first electrode layer are disposed in sequence.

The driving array layer includes multiple thin film transistors. The first insulating layer includes multiple first via holes. The first electrode layer includes multiple first electrodes.

The auxiliary trace layer includes multiple auxiliary traces, and the multiple auxiliary traces are in one-to-one correspondence with the multiple first electrodes. The auxiliary trace are electrically and correspondingly connected to electrodes of the multiple thin film transistors through the multiple first via holes. The second insulating layer includes multiple second via holes, and the auxiliary trace is electrically connected to a respective first electrode through a second via hole.

One embodiment of the present disclosure further provides a manufacturing method of an array substrate. The manufacturing method includes the following steps.

A driving array layer is formed, where the driving array layer includes multiple thin film transistors.

A first insulating layer is formed on the driving array layer, where the first insulating layer includes multiple first via holes.

An auxiliary trace layer is formed on a side of the first insulating layer facing away from the driving array layer, where the auxiliary trace layer includes multiple auxiliary traces, and the multiple auxiliary traces are electrically and correspondingly connected to electrodes of the multiple thin film transistors through the multiple first via holes.

A second insulating layer is formed on a side of the auxiliary trace layer facing away from the driving array layer, where the second insulating layer includes multiple second via holes.

A first electrode layer is formed on a side of the second insulating layer facing away from the driving array layer, where the first electrode layer includes multiple first electrodes, and the multiple first electrodes are in one-to-one correspondence with the multiple auxiliary traces. A first electrode is electrically connected to a respective auxiliary trace through a second via hole.

DETAILED DESCRIPTION

Figure 1:
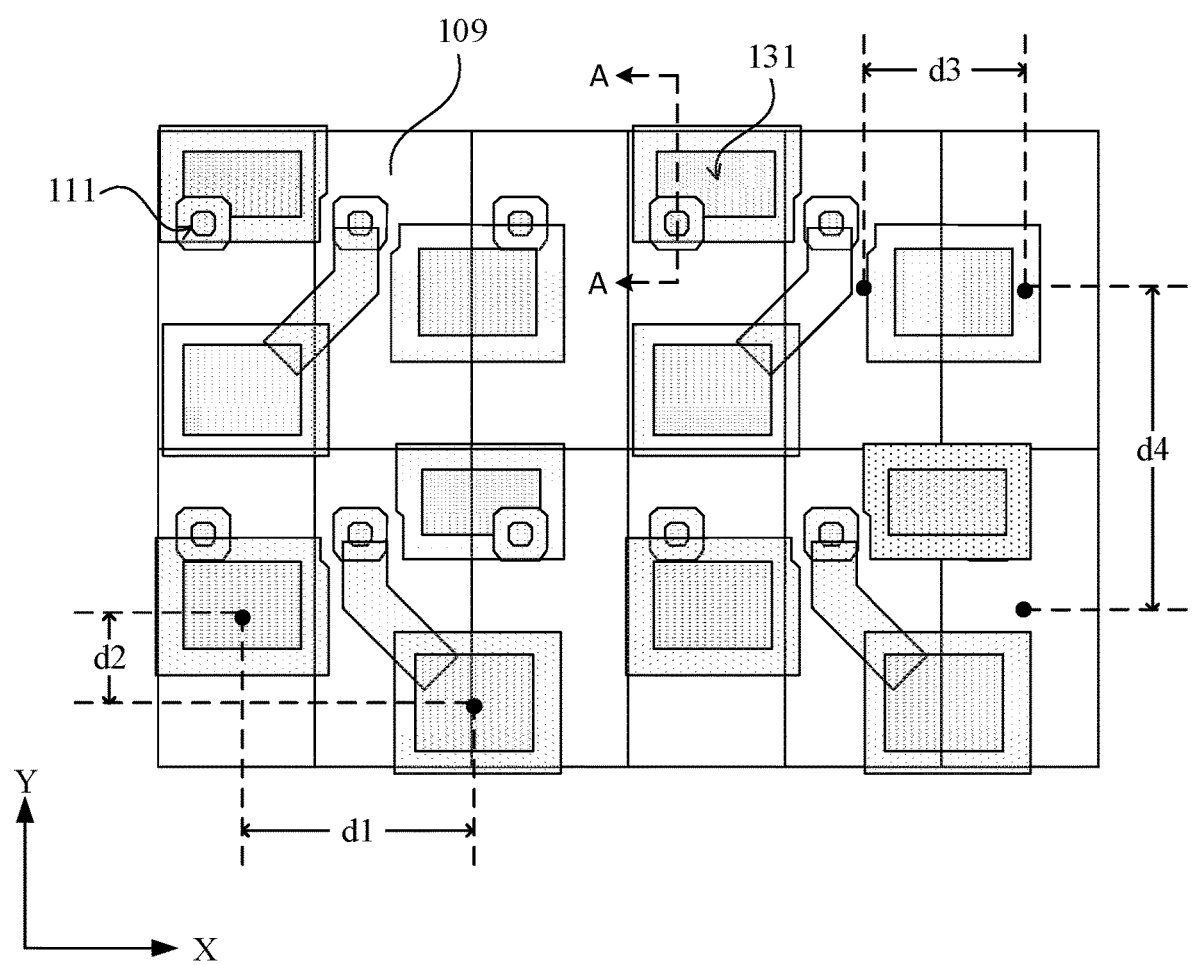
FIG. 1 is a schematic top view of an array substrate of the related art.

Hereinafter the present disclosure will be further described in detail in conjunction with the drawings and embodiments. It is to be understood that the embodiments set forth below are intended to illustrate and not to limit the present disclosure. Additionally, it is to be noted that, for convenience of description, only part, not all, of the structures related to the present disclosure are illustrated in the drawings.

Figure 2:
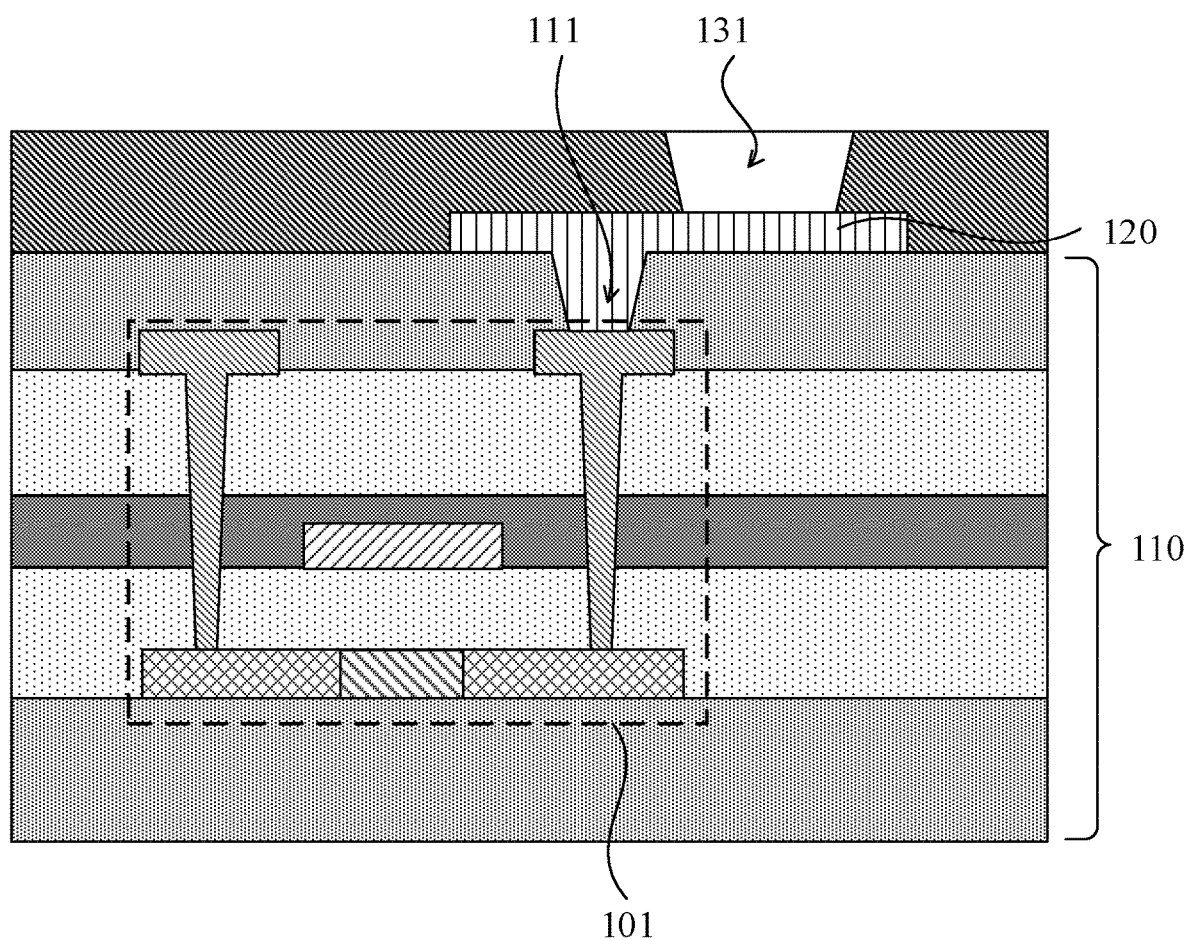
FIG. 2 is a schematic cross-sectional view of FIG. 1 taken along the section A-A.

FIG. 1 is a schematic top view of an array substrate of the related art, and FIG. 2 is a schematic cross-sectional view of FIG. 1 taken along the section A-A. As described in the BACKGROUND, the display panel of the related art has a problem that the light-emitting area is small and that the aperture ratio is low. The inventors research and find that the reason for this problem is as follows: taking an OLED display panel as an example, the OLED display panel includes multiple sub-pixels (for example, red, green and blue (RGB) pixels), and each sub-pixel includes a light-emitting unit and a pixel circuit that drives the light-emitting unit to emit light. Referring to FIGS. 1 and 2, the pixel circuit is disposed on a driving array layer 110 of an OLED array substrate, the pixel circuit includes multiple thin film transistors 101, the electrode of the thin film transistor 101 as an output end of the pixel circuit is electrically connected to a first electrode 120, and a region of the pixel circuit on the OLED array substrate is a pixel circuit region 109. A light-emitting unit is disposed in a light-emitting opening 131 and electrically connected to the first electrode 120, and the pixel circuit supplies a driving current to the light-emitting unit through the first electrode 120.

The light-emitting openings 131 (i.e. the light-emitting units) are arranged in various manners, for example, with standard RGB (real RGB) arrangement and compensation RGB arrangement (rendering RGB). For the real RGB, display is performed by a pixel unit formed jointly by an R light-emitting opening, a G light-emitting opening, and a B light-emitting opening in a same row and adjacent to each other, and the light-emitting openings 131 are arranged in the same row and column manner as the pixel circuit regions 109. In order to achieve high resolution, the light-emitting opening 131 and the pixel circuit region 109 in the display panel need to be disposed small. Since a distance between two adjacent light-emitting units in a row direction for the real RGB is very short, the real RGB has a high requirement on the accuracy of the evaporation mask, so the applicability of the real RGB to high-resolution display panels is limited. For the rendering RGB, the light-emitting openings 131 are reasonably arranged, and then a corresponding driving method is used, so that a high-resolution design can be achieved. Therefore, the rendering RGB is more suitable for the high-resolution display panels than the real RGB.

One commonly-used type of the rendering RGB is a row extension arrangement.

Exemplarily, the arrangement of the light-emitting openings 131 in FIG. 1 is a row extension arrangement. The rendering RGB is different from the real RGB in that for the row extension arrangement, the number of rows of the light-emitting openings 131 is extended so that the number of rows of the light-emitting openings 131 is greater than the number of rows of the pixel circuit regions 109, and the number of columns of the light-emitting openings 131 is less than the number of columns of the pixel circuit regions 109. However, pitch d1 between adjacent light-emitting openings 131 in a row direction X is not equal to pitch d3 between adjacent pixel circuit regions 109 in the row direction X; and pitch d2 between the adjacent light-emitting openings 131 in a column direction Y is not equal to pitch d4 between the adjacent pixel circuit regions 109 in the column direction Y. Part of the light-emitting openings 131 are arranged directly above anode via holes 111, and in order to make pixels emit parallel light, the light-emitting openings 131 are not allowed to directly fall on the anode via holes 111, and opening areas of part of the light-emitting openings 131 need to be sacrificed to avoid the anode via holes 111. Therefore, the display panel of the related art has a problem that the light-emitting area is small and that the aperture ratio is low.

Figure 3:
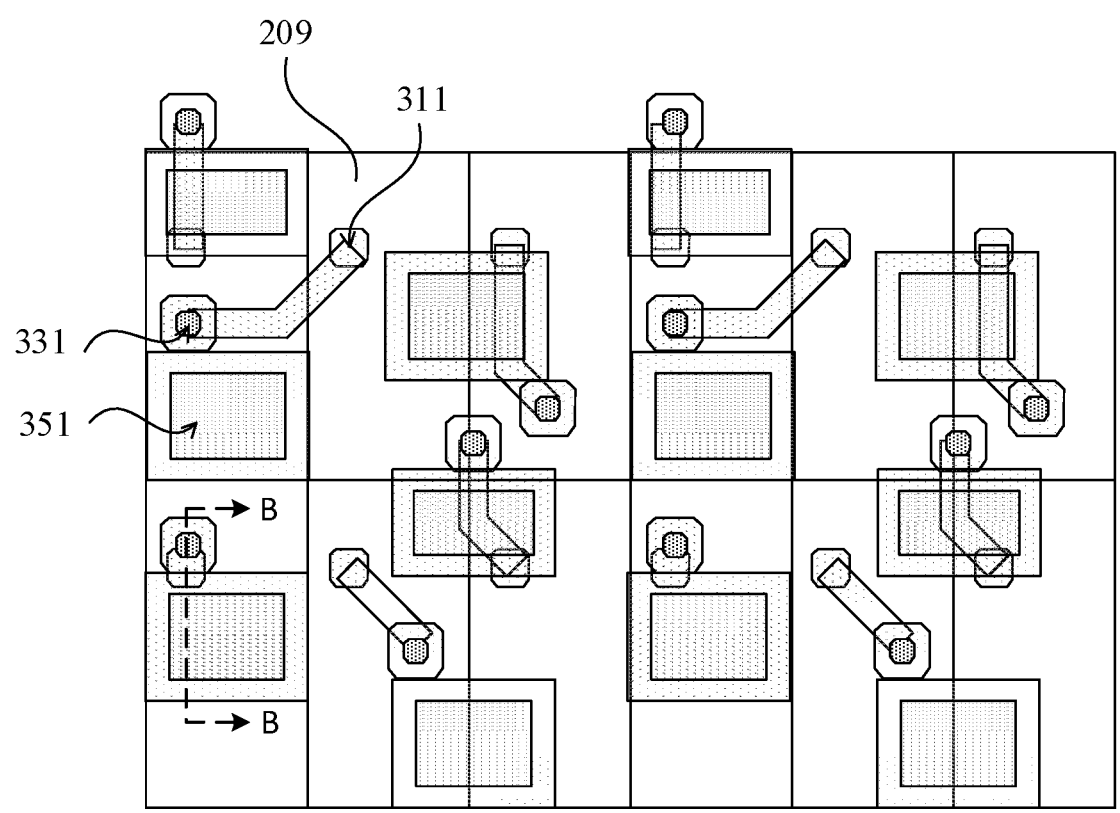
FIG. 3 is a schematic top view of an array substrate according to an embodiment of the present disclosure.
Figure 4:
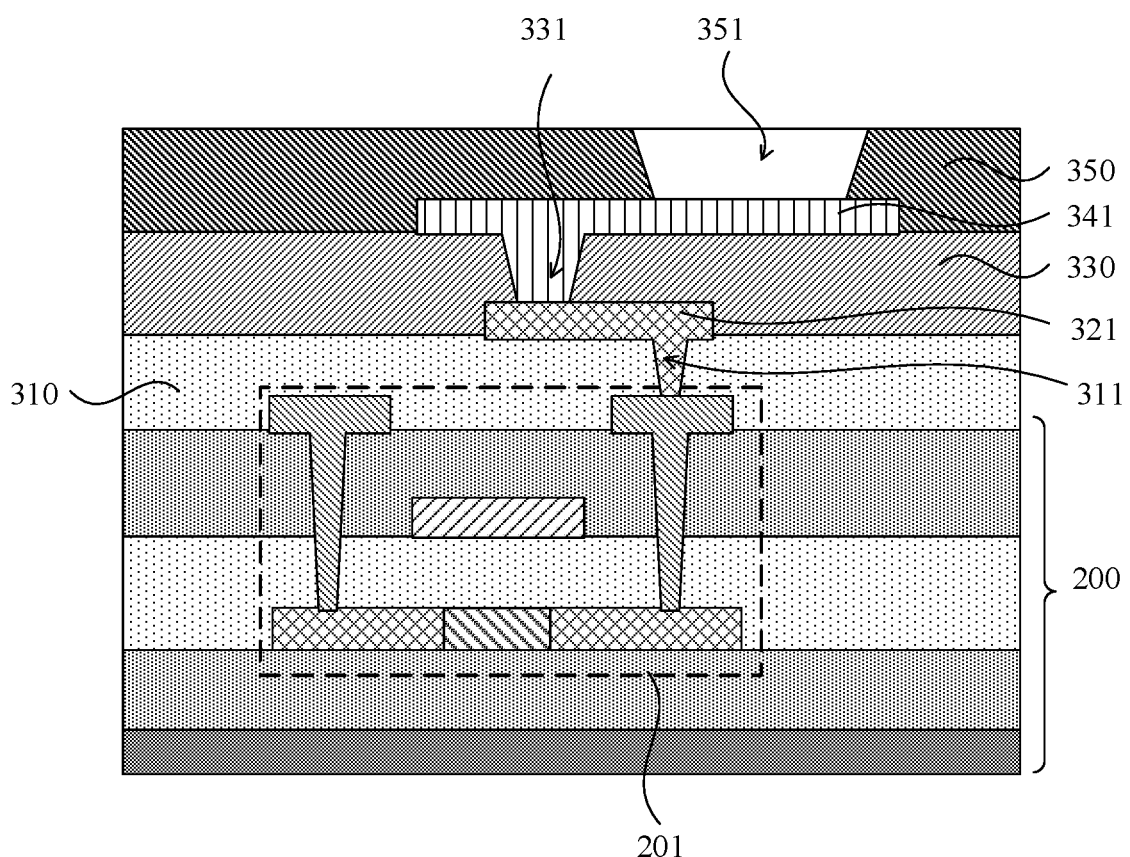
FIG. 4 is a schematic cross-sectional view of FIG. 3 taken along the section B-B.

In view of the above, embodiments of the present disclosure provide an array substrate. FIG. 3 is a schematic top view of an array substrate according to an embodiment of the present disclosure; FIG. 4 is a schematic cross-sectional view of FIG. 3 taken along the section B-B. Referring to FIGS. 3 and 4, the array substrate includes: a driving array layer 200, a first insulating layer 310, an auxiliary trace layer, a second insulating layer 330 and a first electrode layer, where the driving array layer 200, the first insulating layer 310, the auxiliary trace layer, the second insulating layer 330 and the first electrode layer are disposed in sequence. The driving array layer 200 includes multiple thin film transistors 201, the first insulating layer 310 includes multiple first via holes 311, and the first electrode layer includes multiple first electrodes 341. The auxiliary trace layer includes multiple auxiliary traces 321, and the multiple auxiliary traces 321 are in one-to-one correspondence with the multiple first electrodes 341. The auxiliary traces 321 are electrically and correspondingly connected to electrodes of the multiple thin film transistors 201 through the multiple first via holes 311. The second insulating layer 330 includes multiple second via holes 331, and the auxiliary trace 321 is electrically connected to a respective first electrode 341 through a second via hole 331.

The multiple thin film transistors 201 of the driving array layer 200 constitute an input unit, a pull-up unit, an output unit, and the like of a pixel circuit. The thin film transistor 201 as the output unit of the pixel circuit is exemplarily shown in FIG. 2, and an electrode of the thin film transistor 201 is an output end of the pixel circuit. The output end of the pixel circuit provides a driving current for a light-emitting unit through the first via hole 311, the auxiliary trace 321, the second via hole 331, and the first electrode 341 (e.g., an anode of the light-emitting unit) in sequence. Exemplarily, the light-emitting unit is disposed in a light-emitting opening 351 of the array substrate, and the light-emitting opening 351 is disposed corresponding to the first electrode 341.

Figure 5:
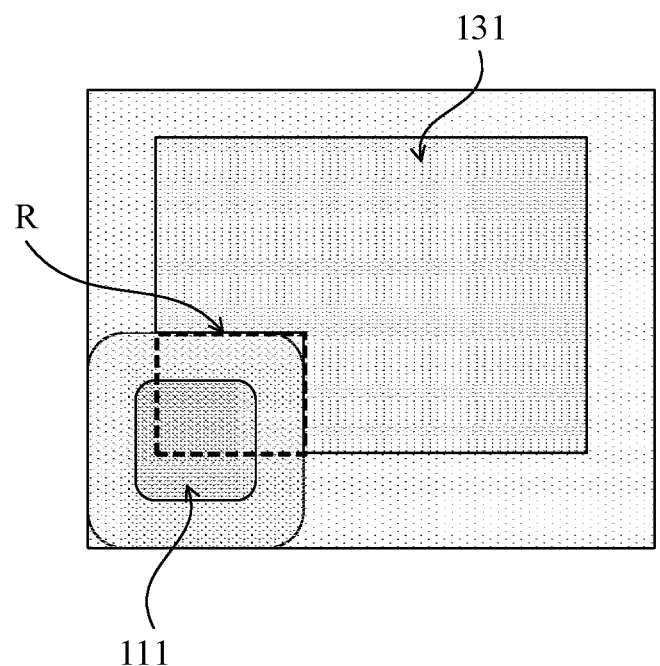
FIG. 5 is a schematic structure diagram of a light-emitting opening of the related art.
Figure 6:
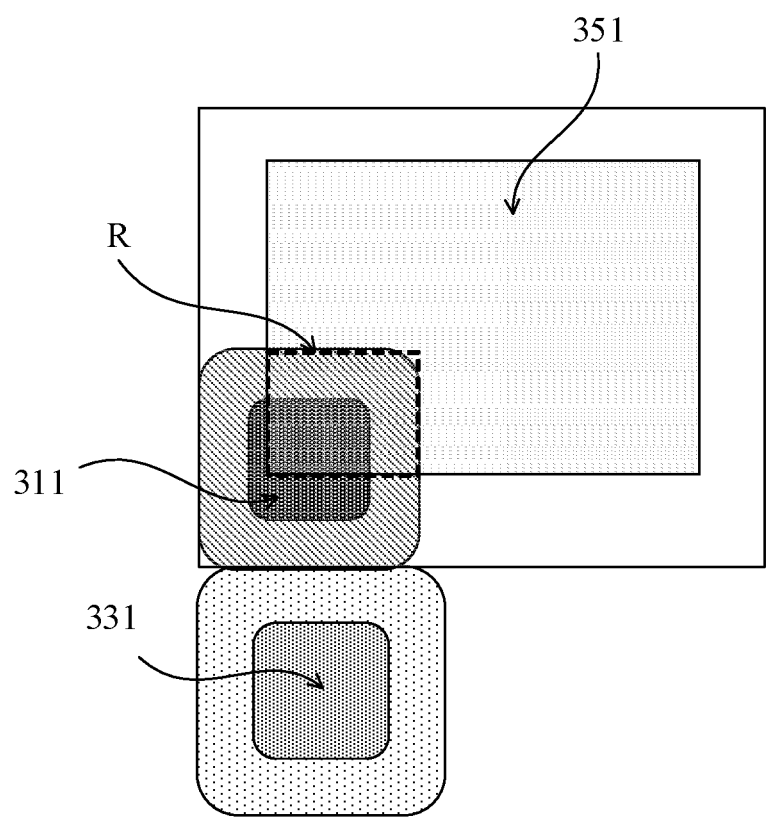
FIG. 6 is a schematic structure diagram of a light-emitting opening according to an embodiment of the present disclosure.

Exemplarily, FIG. 5 is a schematic structure diagram of a light-emitting opening of the related art, and FIG. 6 is a schematic structure diagram of a light-emitting opening according to an embodiment of the present disclosure. Referring to FIGS. 5 and 6, in the related art, when the light-emitting opening 131 cannot avoid the anode via hole 111, a part of the opening area needs to be sacrificed, so the area of a region R of the light-emitting opening 131 is reduced. According to the embodiments of the present disclosure, the first insulating layer 310 and the auxiliary trace layer are disposed, so that the first via hole 311 is moved downwards, and the second via hole 331 in the second insulating layer 330 can be flexibly configured according to the position of the light-emitting opening 351, and avoiding the position of the light-emitting opening 351, so that the light-emitting opening 351 can be completely reserved, and the area of the region R of the light-emitting opening 351 does not need to be reduced.

Exemplarily, the array substrate is manufactured by forming a driving array layer 200, where the driving array layer 200 includes multiple thin film transistors 201; by forming a first insulating layer 310 on the driving array layer 200, where the first insulating layer 310 includes first via holes 311; by forming an auxiliary routing layer on a side of the first insulating layer 310 facing away from the driving array layer 200, where the auxiliary trace layer includes multiple auxiliary traces 321, and an auxiliary trace 321 is electrically connected to an electrode of a corresponding thin film transistor 201 through a first via hole 311; by forming a second insulating layer 330 on a side of the auxiliary trace layer facing away from the driving array layer 200, where the second insulating layer 330 includes second via holes 331; and by forming a first electrode layer on a side of the second insulating layer 330 facing away from the driving array layer 200, where the first electrode layer includes multiple first electrodes 341, the multiple first electrodes 341 are in one-to-one correspondence with the multiple auxiliary traces 321, and a first electrode 341 is electrically connected to a respective auxiliary trace 321 through a second via hole 331.

According to the embodiments of present disclosure, the first insulating layer 310 and the auxiliary trace layer are disposed so that the first via hole 311 is moved downwards, and the second via hole 331 in the second insulating layer 330 can be flexibly configured according to the position of the light-emitting opening 351 to avoid the position of the light-emitting opening 351. The light-emitting opening 351 area is increased in the embodiments of the present disclosure compared with the related art, which is beneficial for increasing a light-emitting area of the display panel and increasing the aperture ratio. An increase in the aperture ratio of the display panel can reduce the current density of the light-emitting unit and reduce the temperature rise, which is beneficial for prolonging the life of the display panel. Moreover, the first insulating layer 310 and the auxiliary trace layer provided in embodiments of the present disclosure can be implemented based on a process of the related art, which is beneficial for reducing the manufacturing cost of the array substrate on the basis of increasing the aperture ratio.

Still referring to FIGS. 3 and 4, on the basis of the above embodiments, the array substrate further includes: a pixel defining layer 350 disposed on a side of the first electrode layer facing away from the first insulating layer 310; the pixel defining layer 350 includes multiple light-emitting openings 351, and the multiple light-emitting openings 351 do not overlap with the multiple second via holes 331 in a direction perpendicular to the driving array layer. Exemplarily, in FIG. 3, the multiple light-emitting openings 351 each on the array substrate do not overlap with the corresponding second via hole 331 in the direction perpendicular to the driving array layer. Therefore, for the array substrate, the area of the light-emitting opening 351 does not need to be reduced to avoid the second via hole 331, is further increasing the aperture ratio of the display panel.

Still referring to FIGS. 3 and 4, on the basis of the above embodiments, at least part of the multiple light-emitting openings 351 overlap with the multiple first via holes 311 in the direction perpendicular to the driving array layer. Since the multiple light-emitting openings 351 are arranged in various manners, exemplarily, if a row extension arrangement is used as the pixel arrangement, at least part of the multiple light-emitting openings 351 overlap with the multiple of first via holes 311 in the direction perpendicular to the driving array layer, for example, in the first row in FIG. 3, the fourth first via hole 311 in the first row overlaps with the third light-emitting opening 351 in the first row in the direction perpendicular to the driving array layer. According to the embodiments of present disclosure, the first insulating layer 310 and the auxiliary trace layer are disposed so that the first via hole 311 is moved downwards, and the second via hole 331 in the second insulating layer 330 can be flexibly configured according to the position of the light-emitting opening 351 to avoid the position of the light-emitting opening 351 and the aperture ratio is increased.

On the basis of the above embodiments, the material of the second insulating layer 330 may be an organic material or an inorganic material. When the second insulating layer is an organic material, polyimide or a photoresist material may be used, and when the organic material is used as the second insulating layer, the treatment may not only play an insulating role, but also play a role of planarizing the anode, to facilitate the manufacturing of the subsequent film layer and improve the display effect; when the second insulating layer is an inorganic material, at least one of silicon oxide or silicon nitride may be included to function as a good insulator.

Figure 7:
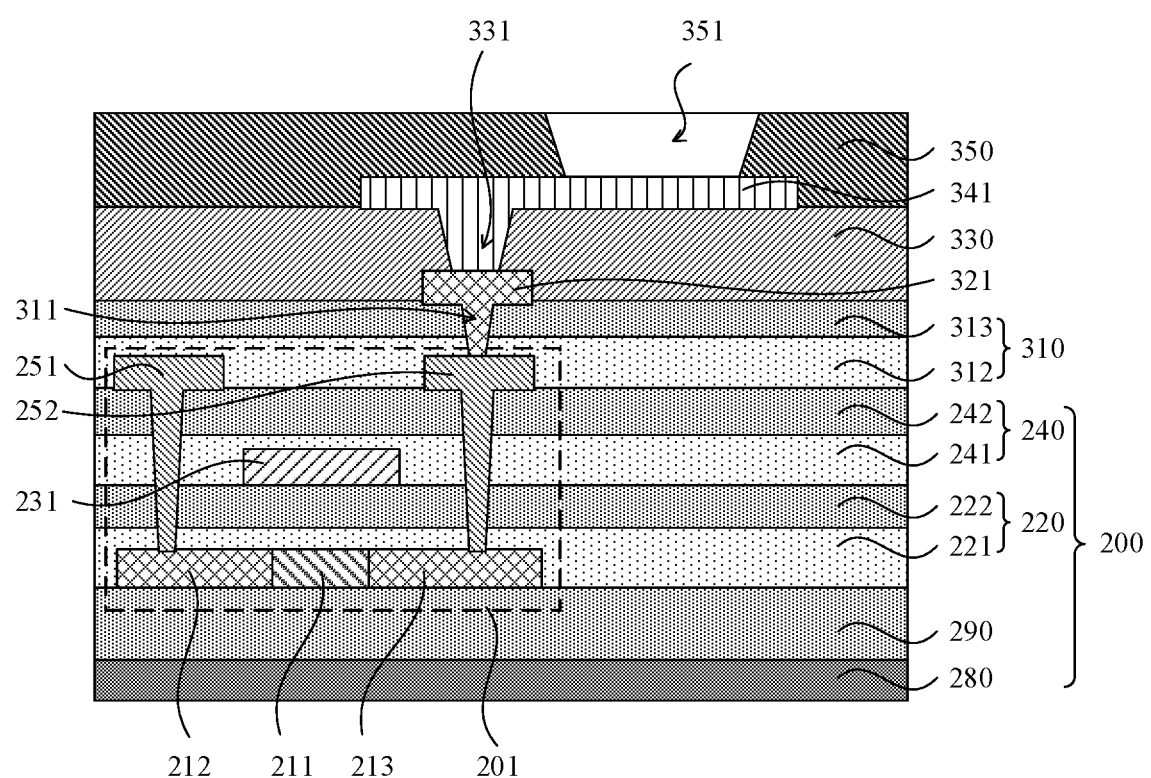
FIG. 7 is a schematic structure diagram of another array substrate according to an embodiment of the present disclosure.

FIG. 7 is a schematic structure diagram of another array substrate according to an embodiment of the present disclosure. Referring to FIG. 7, on the basis of the above embodiments, the first insulating layer 310 includes a first insulating structure layer 312 and a second insulating structure layer 313 which are disposed in sequence, where the material of the first insulating structure layer 312 is silicon oxide (SiOx), and the material of the second insulating structure layer 313 is silicon nitride (SiNx). The SiNx has good insulation and compactness, and is able to avoid element diffusion in the driving array layer 200. The SiOx has good insulation and a small dielectric constant, which is beneficial for reducing the capacitance between the auxiliary trace 321 and the electrode of the thin film transistor 201, and being beneficial for the reduction of interference between the signal lines. According to the embodiments of the present disclosure, the first insulating layer 310 includes the first insulating structure layer 312 and the second insulating structure layer 313 which are disposed in sequence to help avoid element diffusion and interlayer capacitance between the film layers.

Still referring to FIG. 7, on the basis of the above embodiments, the driving array layer 200 further includes: an active layer, a third insulating layer 220, a gate layer, a fourth insulating layer 240, and a source-drain layer, where the active layer, the third insulating layer 220, the gate layer, the fourth insulating layer 240, and the source-drain layer are disposed in sequence; where the active layer includes multiple channel regions 211, multiple first doping regions 212, and multiple second doping regions 213; the third insulating layer 220 includes multiple third via holes and multiple fourth via holes; the gate layer includes multiple gates 231; the fourth insulating layer 240 includes multiple fifth via holes and multiple sixth via holes; the source-drain layer includes multiple sources 251 and multiple drains 252; the multiple sources 251 are electrically connected to the multiple first doping regions 212 through the multiple third via holes and the multiple fifth via holes, and the multiple drains 252 are electrically connected to the multiple second doping regions 213 through the multiple fourth via holes and the multiple sixth via holes; the multiple thin film transistors 201 are comprised of the multiple channel region 211, the multiple first doping regions 212, the multiple second doping regions 213, the multiple gates 231, the multiple sources 251, and the multiple drains 252, and electrodes of the multiple thin film transistors 201 are the multiple sources 251 or the multiple drains 252 (the drain 252 as the electrode of the thin film transistor 201 is exemplarily shown in FIG. 7).

Still referring to FIG. 7, on the basis of the above embodiments, the third insulating layer 220 includes a third insulating structure layer 221 and a fourth insulating structure layer 222 which are disposed in sequence; the fourth insulating layer 240 includes a fifth insulating structure layer 241 and a sixth insulating structure layer 242 which are disposed in sequence. Such setting in the embodiment of the present disclosure is beneficial for avoiding element diffusion between the film layers and reducing interlayer capacitance.

Figure 8:
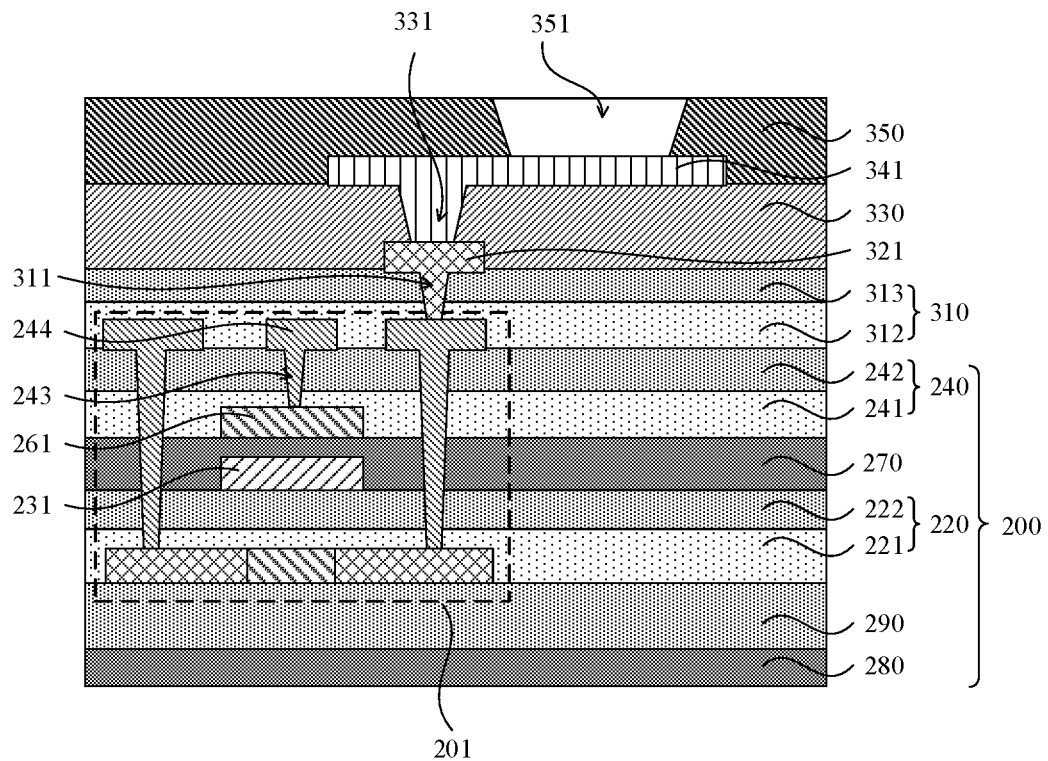
FIG. 8 is a schematic structure diagram of another array substrate according to an embodiment of the present disclosure.

FIG. 8 is a schematic structure diagram of another array substrate according to an embodiment of the present disclosure. Referring to FIG. 8, on the basis of the above embodiments, the driving array layer 200 further includes: a storage capacitor layer, and a fifth insulating layer 270. The fifth insulating layer 270 is disposed on a side of the gate layer facing away from the third insulating layer 220; the storage capacitor layer is disposed on a side of the fifth insulating layer 270 facing away from the third insulating layer 220; the storage capacitor layer includes multiple capacitor electrodes 261; the fifth insulating layer 270 includes multiple seventh via holes and multiple eighth via holes; the multiple sources 251 are electrically connected to the multiple first doping regions 212 through the multiple third via holes, the multiple fifth via holes and the multiple seventh via holes; the multiple drains 252 are electrically connected to the multiple second doping regions 213 through the multiple fourth via holes, the multiple sixth via holes, and the multiple eighth via holes. The capacitor electrode 261 and the gate 231 form a storage capacitor to maintain the gate voltage of the thin film transistor 201 during the process of driving the light-emitting unit to emit light.

Still referring to FIG. 8, on the basis of the above embodiments, the material of the fifth insulating layer 270 is SiNx. The SiNx has good insulation and a large dielectric constant, which is beneficial for increasing the capacitance between the capacitor electrode 261 and the gate 231.

Still referring to FIG. 8, on the basis of the above embodiments, the fourth insulating layer 240 further includes multiple ninth via holes 243, and the source-drain layer further includes multiple power lines 244, and a power line 244 is electrically connected to the capacitor electrode 261 through a ninth via hole 243 to charge the storage capacitor during the process of driving the light-emitting unit to emit light. The power line 244 and the source-drain layer are disposed at the same layer to help make the array substrate light and thin.

Still referring to FIG. 8, on the basis of the above embodiments, the driving array layer 200 further includes: a substrate 280 and a buffer layer 290 to protect the array substrate.

On the basis of the above embodiments, the auxiliary trace layer and a touch electrode layer are disposed in the same layer. Multiple touch electrodes and multiple auxiliary traces are disposed in the touch electrode layer, and the multiple touch electrodes are disposed avoiding the multiple auxiliary traces so that the auxiliary traces are disposed in the touch electrode layer. The auxiliary trace layer and the touch electrode layer are disposed at the same layer in the embodiments of the present disclosure to help make the array substrate light and thin.

It should be noted that in the embodiments of the present disclosure, that the auxiliary trace layer and the touch electrode layer are disposed at the same layer is taken as an example, which is not intended to limit the present disclosure, and in other embodiments, the auxiliary trace layer and a pressure-sensitive touch layer may also be deposed at the same layer, which may be set as required in practical applications.

Figure 9:
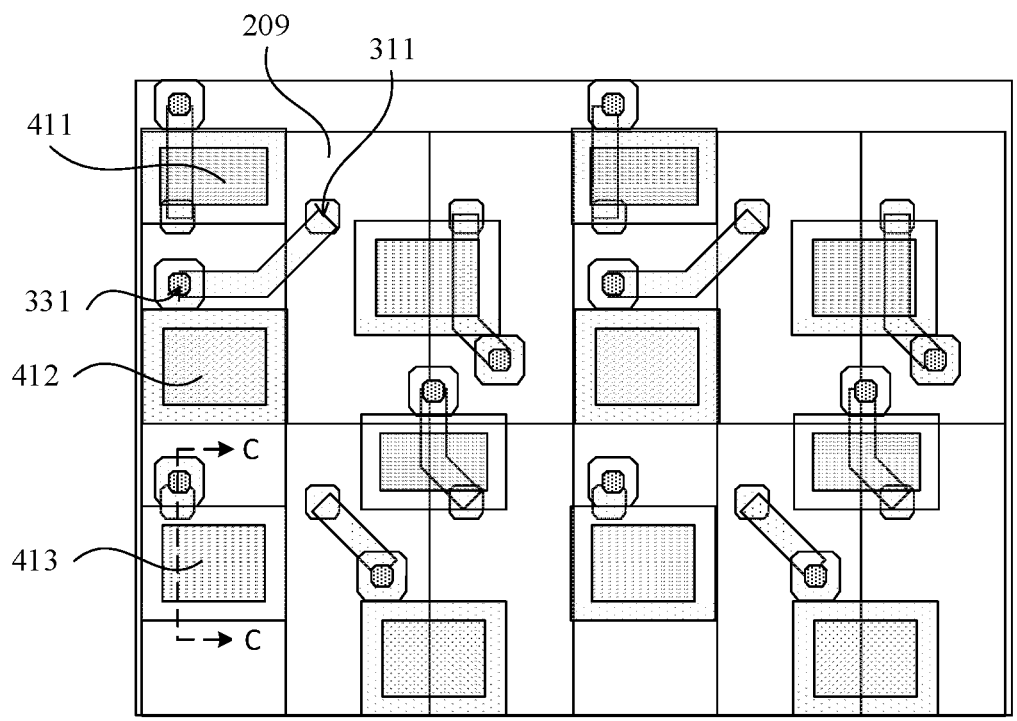
FIG. 9 is a schematic top view of a display panel according to an embodiment of the present disclosure.
Figure 10:
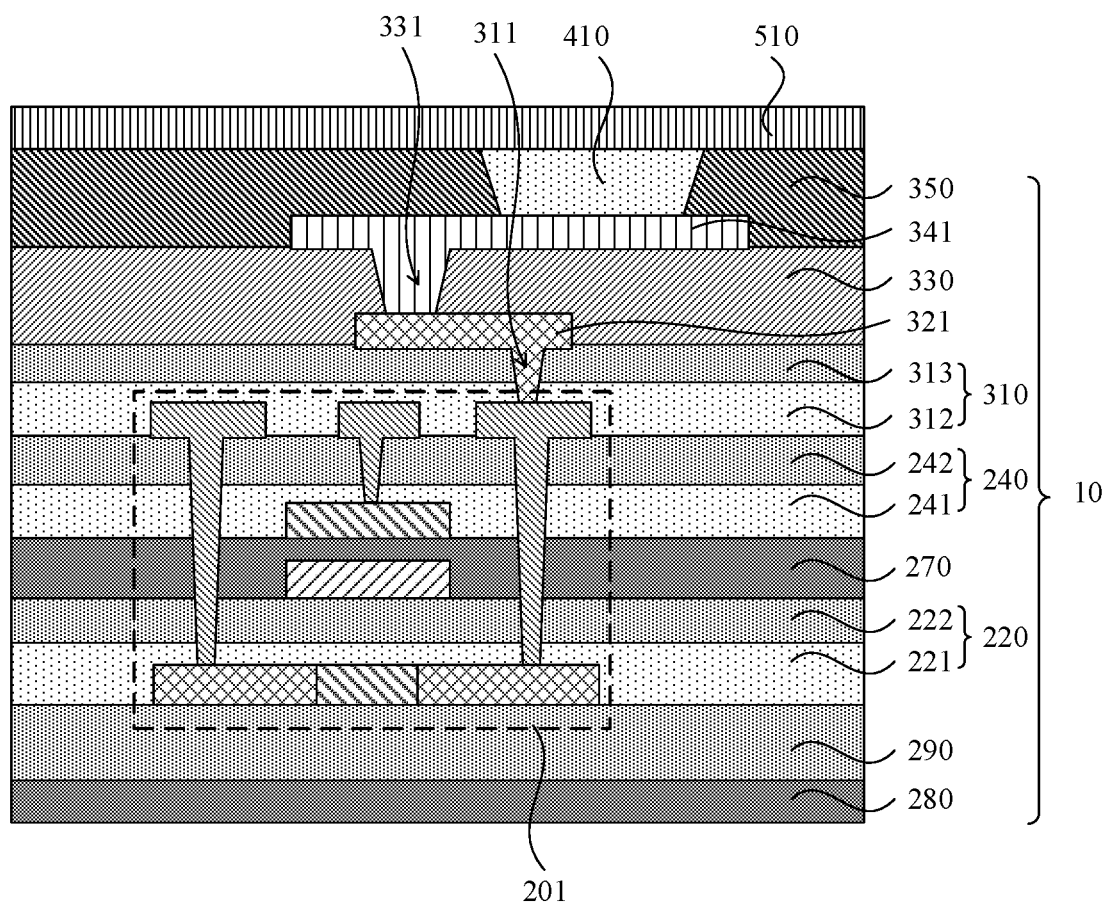
FIG. 10 is a schematic cross-sectional view of FIG. 9 taken along the section C-C.

An embodiment of the present disclosure further provides a display panel. FIG. 9 is a schematic top view of a display panel according to an embodiment of the present disclosure. FIG. 10 is a schematic cross-sectional view of FIG. 9 taken along the line C-C. Referring to FIGS. 9 and 10, the display panel includes: the array substrate 10 provided in any embodiment of the present disclosure, a second electrode 510 and multiple light-emitting units 410; the multiple light-emitting units 410 are disposed between the array substrate 10 and the second electrode 510. The light-emitting unit 410 is disposed in a light-emitting opening of the array substrate 10.

The light-emitting unit 410 may include, for example, an organic light-emitting layer in which an electron and a hole are recombined to generate an exciton. The exciton migrates under the action of an electric field, energy is transferred to a light-emitting molecule, and the electron is excited to transition from a ground state to an excited state. The excited state energy undergoes radiative transition to generate photons and release energy. For another example, the light-emitting unit 410 further includes a hole injection layer, a hole transport layer, an electron blocking layer, an organic light-emitting layer, a hole blocking layer, an electron transport layer, and an electron injection layer, which are sequentially stacked. The hole injection layer, the hole transport layer, the electron blocking layer, the hole blocking layer, the electron transport layer, and the electron injection layer are disposed in the light-emitting unit 410, which is beneficial for the transport of carriers and the improvement of the light-emitting efficiency of the light-emitting unit 410.

According to the embodiments of present disclosure, the first insulating layer 310 and the auxiliary trace layer are disposed in the array substrate 10 so that the first via hole 311 is moved downwards, and the second via hole 331 in the second insulating layer 330 can be flexibly configured according to the position of the light-emitting opening 410 to avoid the position of the light-emitting opening 410. The area of the light-emitting opening 410 is increased in the embodiments of the present disclosure compared with the related art, which is and beneficial for increasing the light-emitting area of the display panel and increasing the aperture ratio. An increase in the aperture ratio of the display panel can reduce the current density of the light-emitting unit and reduce the temperature rise, which is and beneficial for prolonging the life of the display panel. Moreover, the first insulating layer 310 and the auxiliary trace layer provided in the embodiments of the present disclosure can be implemented based on a process of the related art, which is beneficial for reducing the manufacturing cost of the array substrate on the basis of increasing the aperture ratio.

Still referring to FIGS. 9 and 10, on the basis of the above embodiments, the array substrate 10 includes multiple pixel circuit regions 209 arranged in an array, and the multiple pixel circuit regions 209 include the thin film transistors 201; the array of the multiple pixel circuit regions 209 includes N1 rows and M1 columns, and N1 and M1 are positive integers (2 rows and 6 columns are exemplarily included in FIG. 9); the relative positions of the first via holes 311 in the corresponding pixel circuit regions 209 are the same. In the embodiments of the present disclosure, the multiple pixel circuit regions 209 are configured as a matrix of N1 rows and M1 columns, which is beneficial for the layout of the array substrate 10 and the reduction of the layout difficulty of the array substrate 10.

Still referring to FIG. 9, on the basis of the above embodiments, multiple light-emitting units 410 are arranged in an array; and the array of the multiple light-emitting units 410 includes N2 rows and M2 columns, where N2 and M2 are both positive integers, N1×M1=N2×M2, N1≠N2, and M1≠M2.

The multiple light-emitting units 410 may be arranged in various manners, and exemplarily, the multiple light-emitting units 410 are arranged in a row extension manner. The arrangement of the multiple light-emitting units 410 is different from the arrangement of the multiple pixel circuit regions 209, so that the arrangement of the multiple light-emitting units 410 is more flexible. The light-emitting openings 131 are reasonably arranged in the row extension manner and the corresponding driving method is used so that the sensory resolution may be improved under the condition that the density of the light-emitting units 410 is unchanged. The arrangement of the light-emitting units 410 is different from the arrangement of the multiple pixel circuit regions 209 in the embodiments of the present disclosure, so that the arrangement of the light-emitting units 410 is more flexible, and the resolution of the display panel is improved.

Still referring to FIG. 9, on the basis of the above embodiments, N2>N1; the light-emitting unit includes multiple first light-emitting units 411, multiple second light-emitting units 412, and multiple third light-emitting units 413; part of the multiple first light-emitting units in the (3i+1)-th row and part of the multiple third light-emitting units 413 in the (3i+1)-th row are disposed at intervals, part of the multiple second light-emitting units in the (3i+2)-th row and part of the multiple first light-emitting units 411 in the (3i+2)-th row are disposed at intervals, and part of the multiple third light-emitting units in the (3i+3)-th row and part of the multiple second light-emitting units 412 are disposed at intervals; i is a non-negative integer; part of the multiple first via holes 311 in the k-th row are electrically connected to all of the multiple light-emitting units in the (2 k−1)-th row and part of the multiple second via holes 331 in the k-th row are electrically connected to part of the multiple light-emitting units in the 2 k-th row, and k is a positive integer.

Exemplarily, multiple light-emitting units arranged in a row extension manner are shown in FIG. 9. The array of the multiple pixel circuit regions 209 includes 2 rows and 6 columns, and the array of light-emitting units is 3 rows and 4 columns, so that a distance between light-emitting units of adjacent columns increases, which is beneficial for reducing the difficulty of the masking process of an evaporation process. Moreover, a first light-emitting unit 411, a second light-emitting unit 412, a the third light-emitting unit 413 may be, for example, a red light-emitting unit 411, a green light-emitting unit 412, and a blue light-emitting unit 413, respectively. As may be seen from FIG. 9, adjacent to the red light-emitting unit 411 is an equal number of green light-emitting units 412 and blue light-emitting units 413, and the red light-emitting unit 411 and any of the green light-emitting units 412 and any of the blue light-emitting units 413 may form a pixel; adjacent to the green light-emitting unit 412 is an equal number of red light-emitting units 411 and blue light-emitting units 413, and the green light-emitting unit 412 and any of the red light-emitting units 411 and any of the blue light-emitting units 413 may form a pixel; adjacent to the blue light-emitting unit 413 is an equal number of red light-emitting units 411 and green light-emitting units 412, and the blue light-emitting unit 413 and any of the red light-emitting units 411 and any of the green light-emitting unit 412 may form a pixel. Therefore, the embodiment of the present disclosure is beneficial for improving the resolution of the display panel on the basis of reducing the process difficulty.

Figure 11:
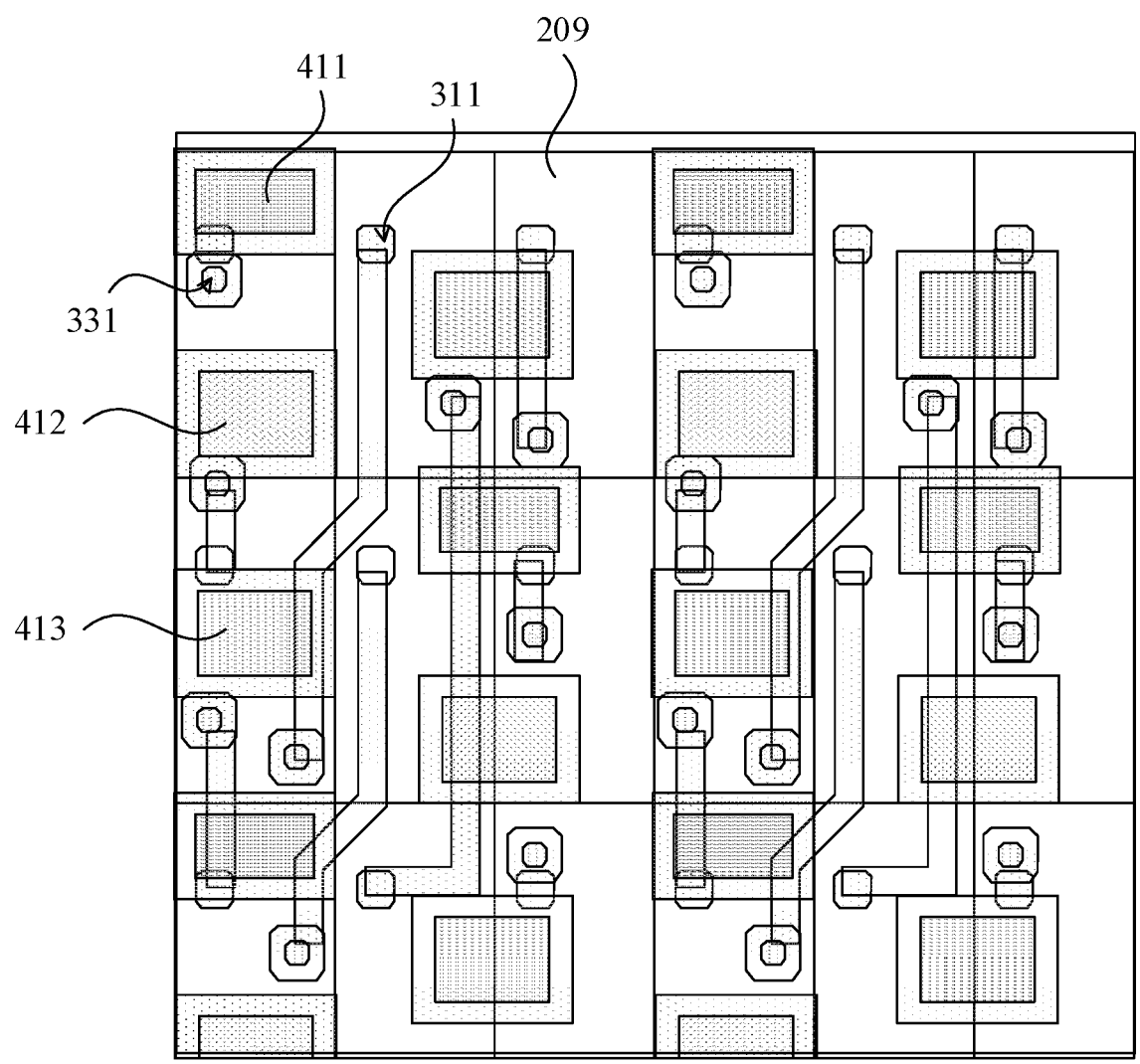
FIG. 11 is a schematic top view of another display panel according to an embodiment of the present disclosure.

FIG. 11 is a schematic top view of another display panel according to an embodiment of the present disclosure. Referring to FIG. 11, on the basis of the above embodiments, first via holes 311 in the (3 k+1)-th row are electrically connected to the multiple first light-emitting units 411; first via holes 311 in the (3 k+2)-th row are electrically connected to the multiple second light-emitting units 412; first via holes 311 in the (3 k+3)-th row is electrically connected to the multiple third light-emitting unit 413.

In a connection manner in which first via holes 311 in one row are all electrically connected to the same type of light-emitting units, one type of the light-emitting units may be driven to emit light during the driving process of the light-emitting units. Exemplarily, by using the connection manner of the multiple first via holes 311 and the light-emitting units provided by the embodiment of the present disclosure, the pseudo frame frequency driving method may be used to drive the light-emitting units to emit light. The pseudo frame frequency driving method may be, for example, driving all of the multiple second light-emitting units 412, part of the multiple first light-emitting units 411, and part of the multiple third light-emitting units 413 to emit light in an odd frame; and driving all of the multiple second light-emitting units 412, another part of the multiple first light-emitting units 411 and another part of the multiple third light-emitting units 413 to emit light in an even frame. It can be seen that in the pseudo frame frequency driving method, only part of the light-emitting units are driven to emit light in each frame. In the embodiment of the present disclosure, the first via holes 311 in one row are all electrically connected to the same type of light-emitting units, which is beneficial for driving the light-emitting units to emit light by using the pseudo frame frequency driving method, which is and beneficial for reducing the power consumption of the display panel.

Still referring to FIG. 11, on the basis of the above embodiments, the pseudo frame frequency driving method is adopted for the display panels arranged in the row extension manner. Exemplarily, the first via holes 311 in the (3 k+1)-th row are electrically connected to the first light-emitting units 411 in the (5 k+1)-th row, the (5 k+4)-th row, and the (5 k+2)-th row respectively, and the first via holes 311 in the (3 k+2)-th row are electrically connected to the second light-emitting units 412 in the (5 k+2)-th row, the (5 k+5)-th row, and the (5 k+3)-th row respectively, and the first via holes 311 in the (3k+3)-th row are electrically connected to the third light-emitting units 413 in the (5k+3)-th row, the (5k+1)-th row, and the (5k+4)-th row respectively; where k is a non-negative integer.

The distance between the first via holes 311 in the first row and the first light-emitting units 411 in the second row is long, and the auxiliary traces overlaps with the third light-emitting units 413 in the direction perpendicular to the driving array layer. Therefore, if the display panel of the related art is used, it is necessary to additionally provide traces in the source-drain layer to connect the first via holes 311 in the first row with the first light-emitting units 411 in the second row. However, the source-drain layer also needs to be provided with data lines and power lines. Therefore, the space for disposing the traces in the source-drain layer is very limited, and the pseudo frame frequency driving method is difficult to implement in the display panel of the related art, and even cannot be implemented. Even if the pseudo frame frequency driving method may be implemented in the display panel of the related art, it is necessary to sacrifice the light-emitting area of the third light-emitting unit 413, resulting in a very low aperture ratio of the display panel. In embodiments of the present disclosure, the auxiliary trace layer and the first insulating layer 310 are disposed so that the first via holes 311 are moved downward, and the second via holes 331 in the second insulating layer 330 may be flexibly configured according to the position of the light-emitting openings, and avoiding the interruption of the connection between the first via holes 311 and the light-emitting units, so that the pseudo frame frequency driving method can be implemented in the display panels arranged in the row extension manner. On the basis of the above embodiments, the display panel is an organic light-emitting diode display panel or a micro light-emitting diode display panel.

Figure 12:
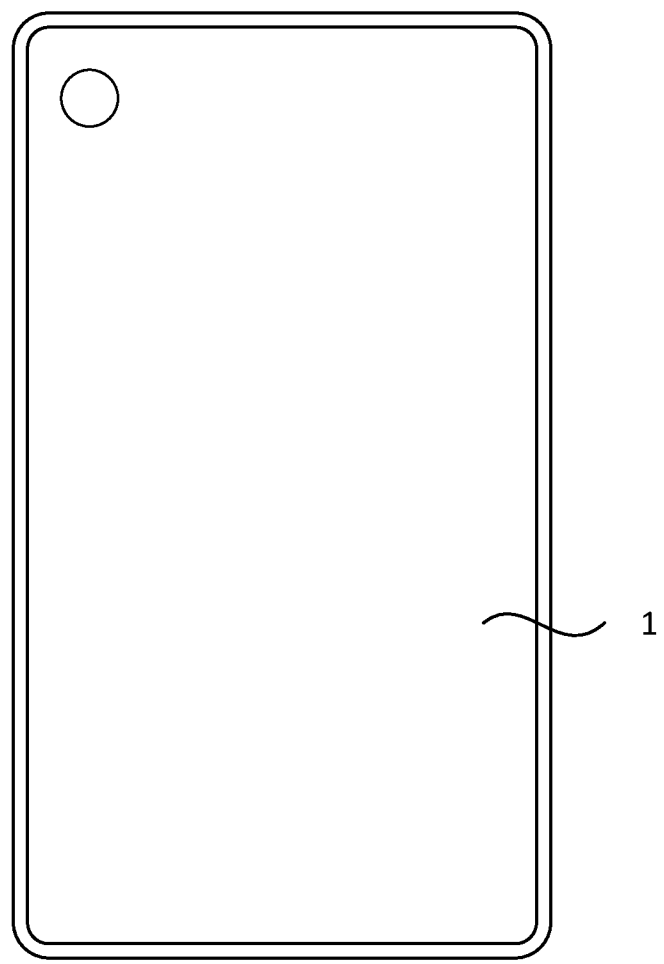
FIG. 12 is a schematic structure diagram of a display device according to an embodiment of the present disclosure.

An embodiment of the present disclosure further provides a display device. FIG. 12 is a schematic structure diagram of a display device according to an embodiment of the present disclosure. Referring to FIG. 12, the display device includes the display panel provided by any embodiment of the present disclosure. The display device may be, for example, a mobile phone, a tablet computer, a computer, a wearable device, a television or an information inquiry machine.

In the embodiment of the present disclosure, the first insulating layer and the auxiliary trace layer are disposed in the array substrate so that the first via hole is moved downward, and the second via hole in the second insulating layer may be flexibly configured according to the position of the light-emitting opening to avoid the position of the light-emitting opening. An area of the light-emitting opening is increased in embodiments of the present disclosure compared with the related art, which is and beneficial for increasing a light-emitting area of the display panel and increasing the aperture ratio. An increase in the aperture ratio of the display panel can reduce the current density of the light-emitting unit and reduce the temperature rise, which is beneficial for prolonging the life of the display panel. Moreover, the first insulating layer and the auxiliary trace layer provided in embodiments of the present disclosure can be implemented based on a process of the related art, which is beneficial for reducing the manufacturing cost of the array substrate on the basis of increasing the aperture ratio.

Figure 13:
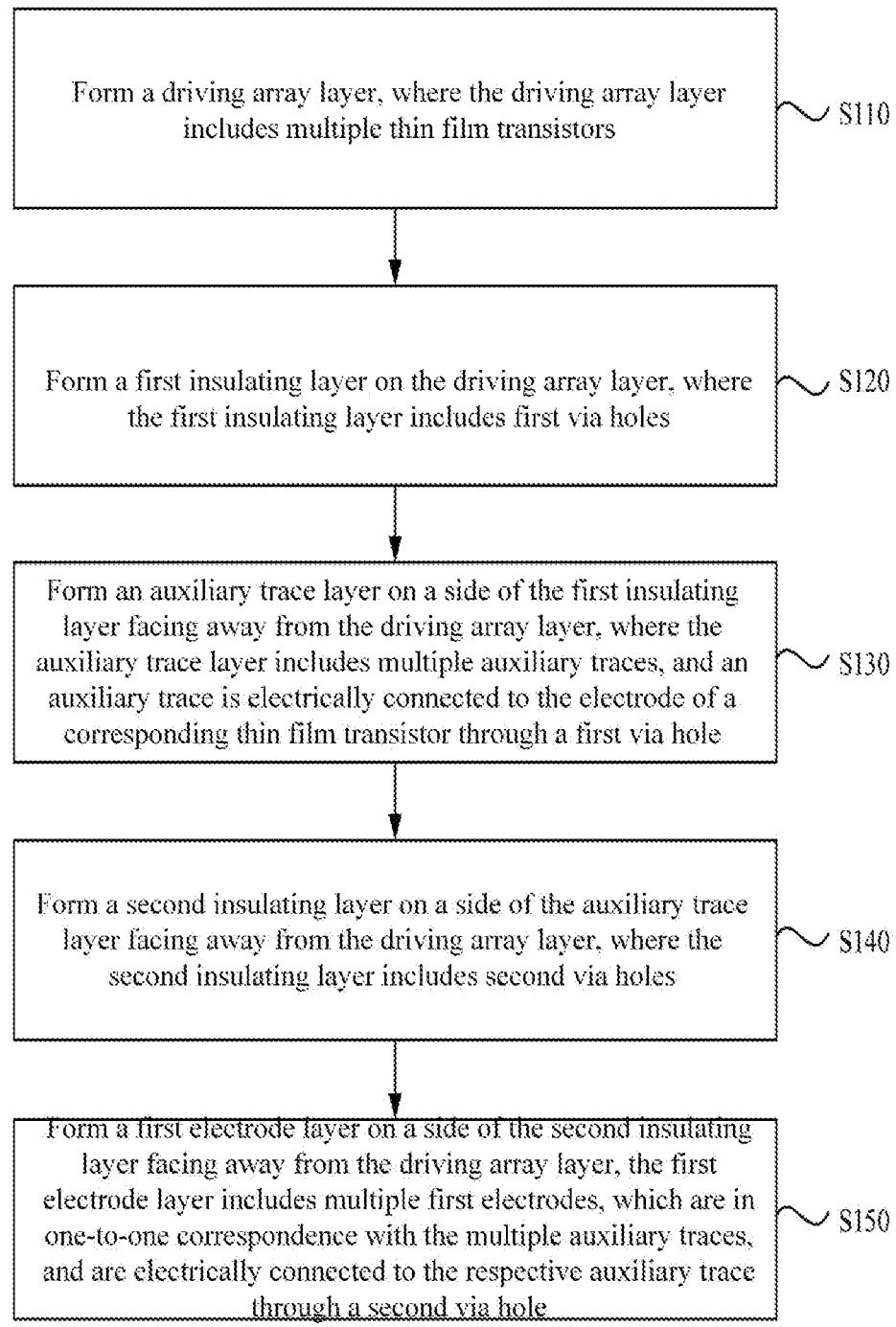
FIG. 13 is a flowchart of a manufacturing method of an array substrate according to an embodiment of the present disclosure.
Figure 14:
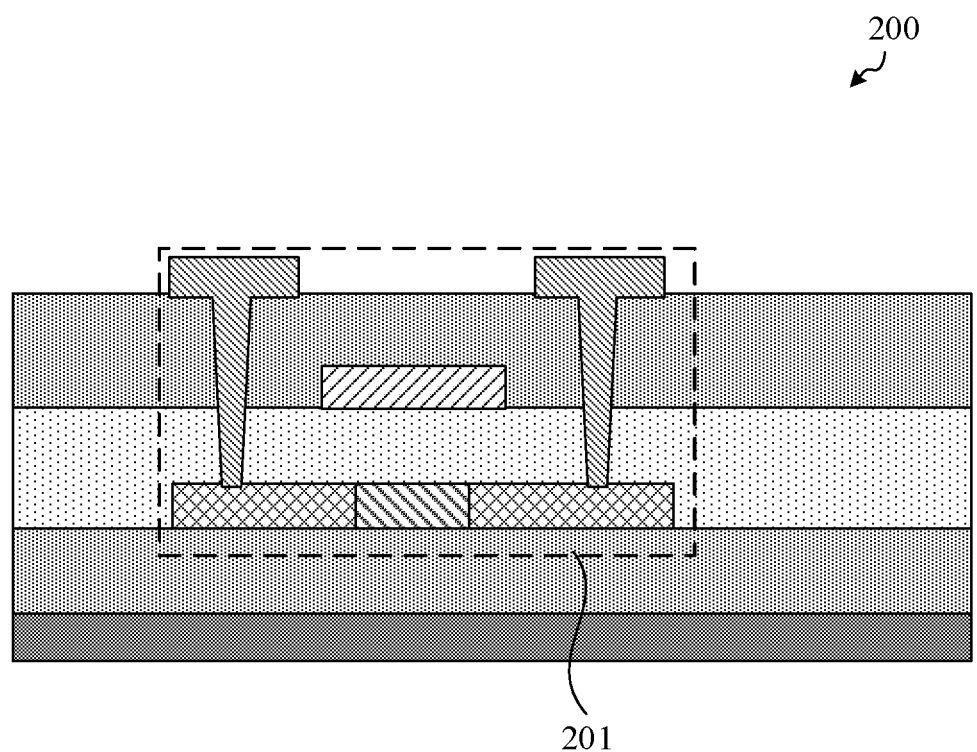
FIGS. 14 to 19 are schematic structure diagrams of an array substrate formed in various steps in a manufacturing process of the array substrate.
Figure 15:
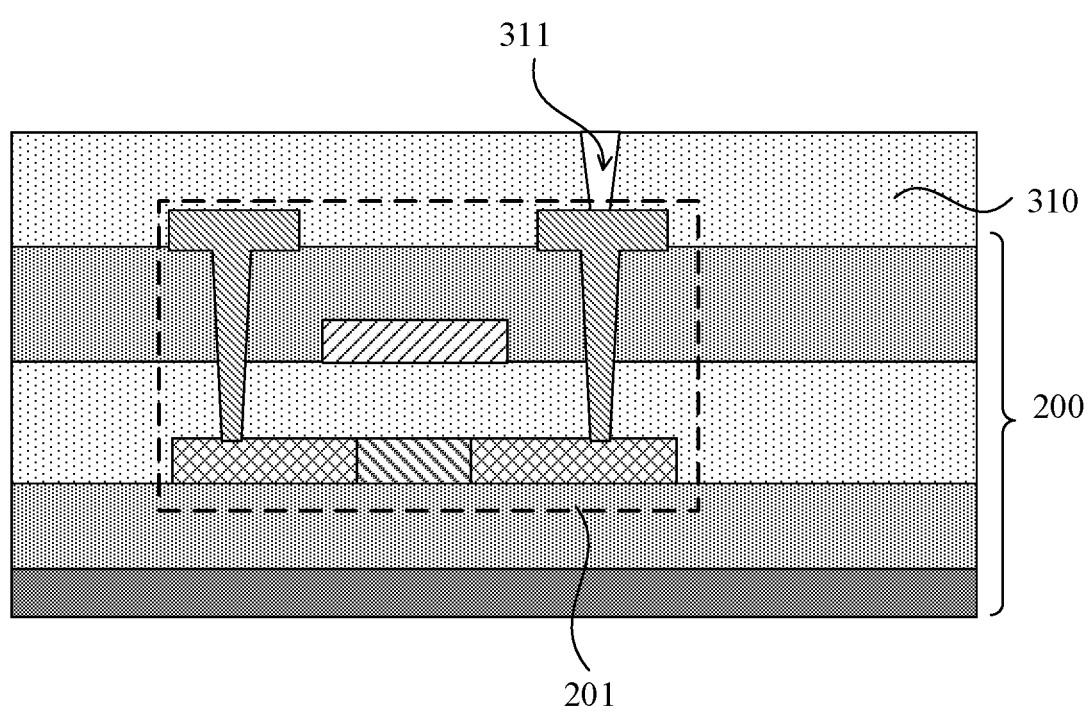
Figure 16:
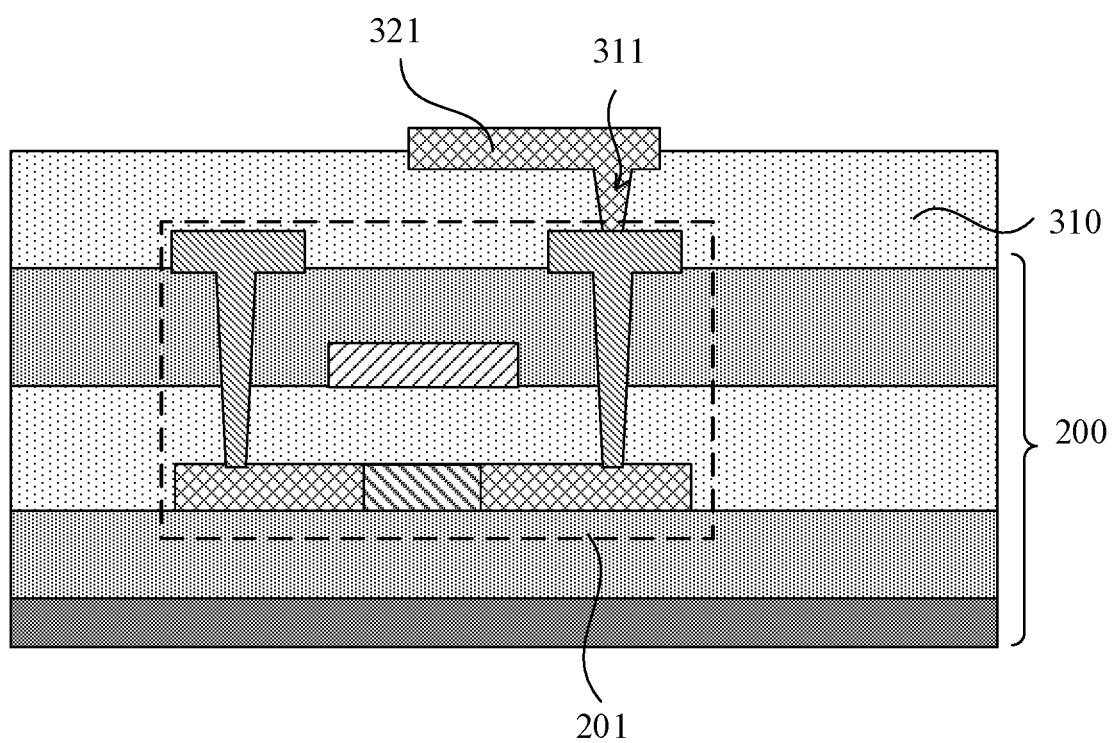
Figure 17:
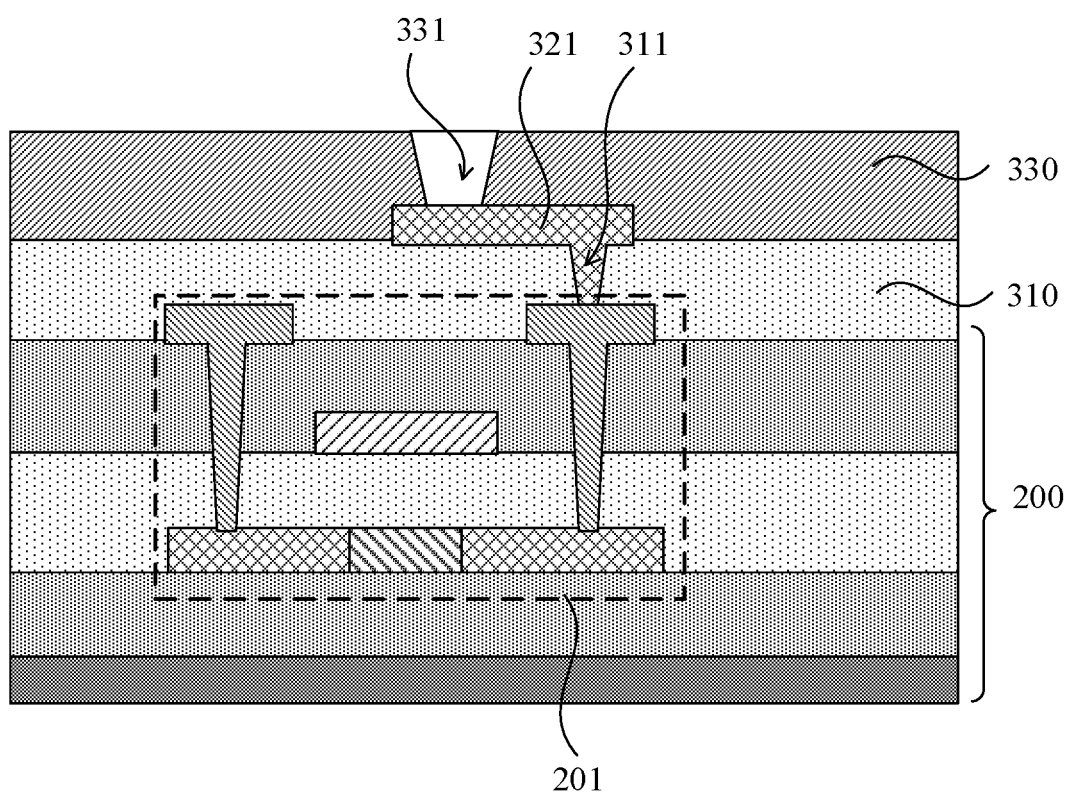
Figure 18:
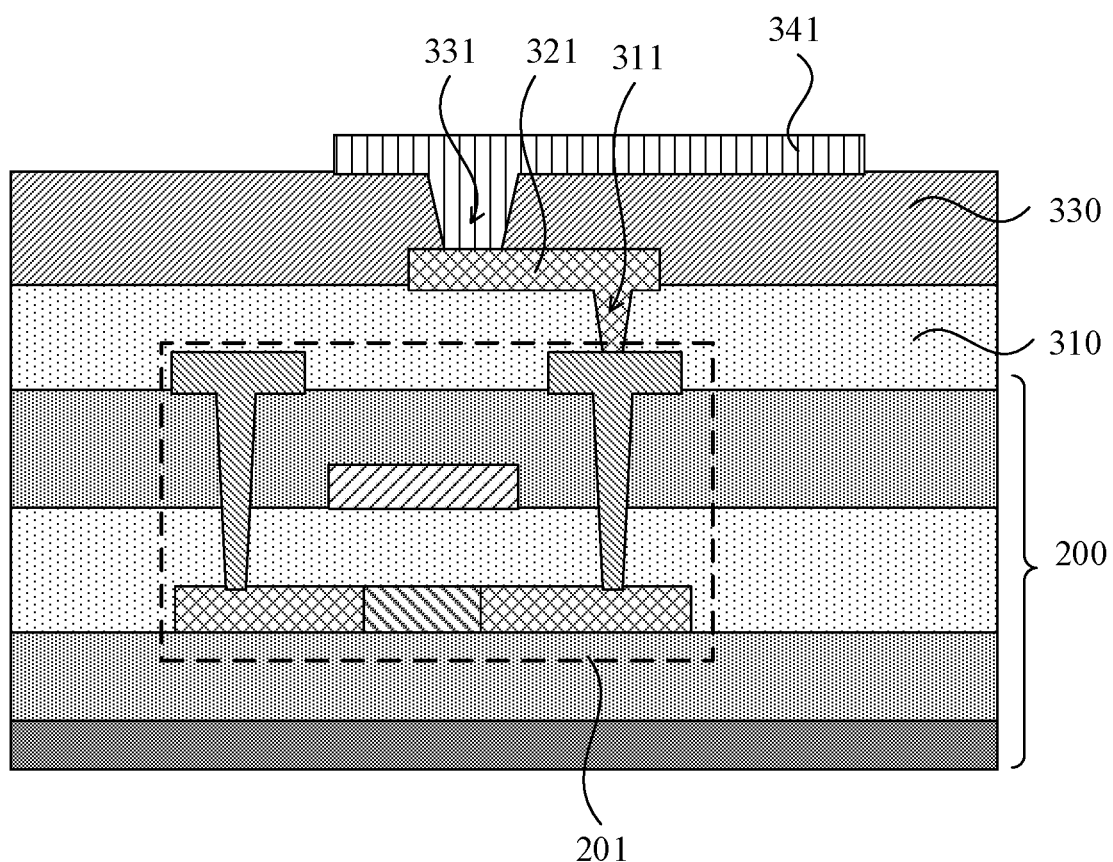

An embodiment of the present disclosure further provides a manufacturing method of an array substrate. FIG. 13 is a flowchart of a manufacturing method of an array substrate according to an embodiment of the present disclosure. FIGS. 14 to 18 are schematic structure diagrams of an array substrate formed in various steps in the manufacturing process of the array substrate. Referring to FIGS. 13 to 18, the manufacturing method of the array substrate includes the steps described below.

In S110, a driving array layer 200 is formed, where the driving array layer 200 includes multiple thin film transistors 201.

In S120, a first insulating layer 310 is formed on the driving array layer 200, where the first insulating layer 310 includes multiple first via holes 311.

In S130, an auxiliary trace layer is formed on a side of the first insulating layer 310 facing away from the driving array layer 200, where the auxiliary trace layer includes multiple auxiliary traces 321, and the multiple auxiliary traces 321 are electrically and correspondingly connected to electrodes of the multiple thin film transistors 201 through the multiple first via holes.

In S140, a second insulating layer 330 is formed on a side of the auxiliary trace layer facing away from the driving array layer 200, where the second insulating layer 330 includes multiple second via holes 331.

In S150, a first electrode layer is formed on a side of the second insulating layer 330 facing away from the driving array layer 200, where the first electrode layer includes multiple first electrodes 341, and the multiple first electrodes 341 are in one-to-one correspondence with the multiple auxiliary traces 321. The first electrode 341 is electrically connected to the respective auxiliary trace 321 through a second via hole 331.

According to the embodiment of present disclosure, the first insulating layer 310 and the auxiliary trace layer are disposed so that the first via holes 311 is moved downwards, and the second via holes 331 in the second insulating layer 330 can be flexibly configured according to the position of the light-emitting openings to avoid the position of the light-emitting openings and implement the connection between the thin film transistor 201 and the first electrode 341. A light-emitting opening area is increased in embodiments of the present disclosure compared with the related art, which is beneficial for increasing a light-emitting area of the display panel and increasing the aperture ratio. An increase in the aperture ratio of the display panel can reduce the current density of the light-emitting unit and reduce the temperature rise, which is beneficial for prolonging the life of the display panel. Moreover, the first insulating layer 310 and the auxiliary trace layer provided in embodiments of the present disclosure can be implemented based on a process of the related art, which is beneficial for reducing the manufacturing cost of the array substrate on the basis of increasing the aperture ratio.

Figure 19:
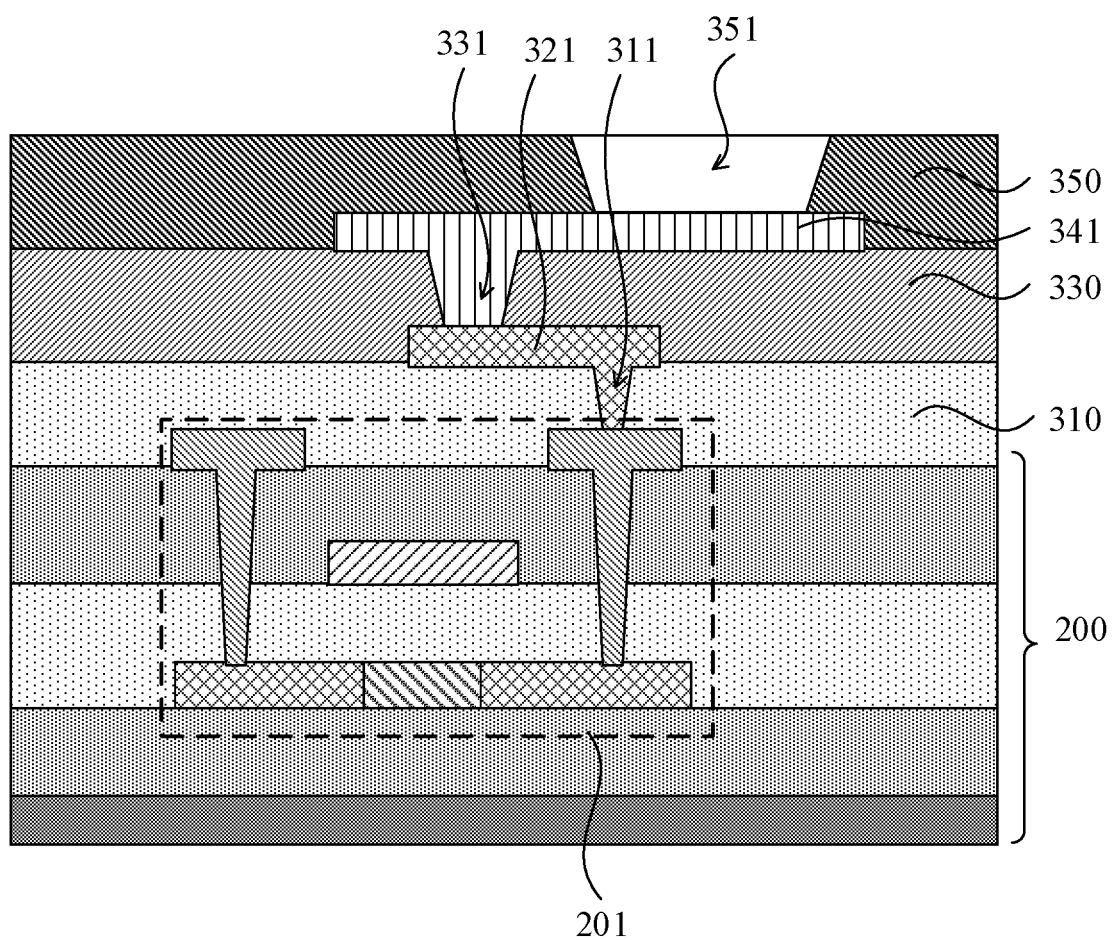

Referring to FIG. 19, on the basis of the above embodiments, after forming the first electrode layer, the method further includes: a pixel defining layer 350 is formed on a side of the first electrode layer facing away from the driving array layer 200, where the pixel defining layer 350 includes multiple light-emitting openings 351, and the multiple light-emitting openings 351 do not overlap with the second via holes 331 in the direction perpendicular to the driving array layer. Therefore, for the array substrate, the area of the light-emitting opening 351 does not need to be reduced to avoid the second via hole 331, and further increasing the aperture ratio of the display panel.

On the basis of the above embodiments, the material of the first insulating layer includes at least one of SiOx or SiNx to function as a good insulator.

On the basis of the above embodiments, the step of forming the first insulating layer includes: sequentially forming a first insulating structure layer and a second insulating structure layer, where the material of the first insulating structure layer is SiOx, and the material of the second insulating layer is SiNx or an organic material. According to the embodiment of the present disclosure, the second insulating layer includes the first insulating structure layer and the second insulating structure layer disposed in sequence for avoiding element diffusion between the film layers and increasing interlayer capacitance.

What is claimed is:

1. An array substrate, comprising:
a driving array layer, a first insulating layer, an auxiliary trace layer, a second insulating layer and a first electrode layer, wherein the driving array layer, the first insulating layer, the auxiliary trace layer, the second insulating layer and the first electrode layer are disposed in sequence;
wherein the driving array layer comprises a plurality of thin film transistors, the first insulating layer comprises a plurality of first via holes, and the first electrode layer comprises a plurality of first electrodes; and
wherein the auxiliary trace layer comprises a plurality of auxiliary traces, the plurality of auxiliary traces are in one-to-one correspondence with the plurality of first electrodes, and the plurality of auxiliary traces are electrically and correspondingly connected to electrodes of the plurality of thin film transistors through the plurality of first via holes; the second insulating layer comprises a plurality of second via holes, and the each of the plurality of auxiliary traces is electrically connected to a respective one of the plurality of first electrodes through one of the plurality of second via holes,
wherein the auxiliary trace layer and a touch electrode layer are disposed on a same layer.

2. The array substrate of claim 1, further comprising:
a pixel defining layer, wherein the pixel defining layer is disposed on a side of the first electrode layer facing away from the first insulating layer; and wherein the pixel defining layer comprises a plurality of light-emitting openings, and the plurality of light-emitting openings do not overlap with the plurality of second via holes in a direction perpendicular to the driving array layer.

3. The array substrate of claim 2, wherein at least part of the plurality of light-emitting openings overlap with the plurality of first via holes in the direction perpendicular to the driving array layer.

4. The array substrate of claim 1, wherein a material of the first insulating layer comprises at least one of silicon oxide and silicon nitride.

5. The array substrate of claim 4, wherein the first insulating layer comprises a first insulating structure layer and a second insulating structure layer which are disposed in sequence, wherein a material of the first insulating structure layer is the silicon oxide, and a material of the second insulating structure layer is the silicon nitride.

6. The array substrate of claim 1, wherein the driving array layer comprises:
an active layer, a third insulating layer, a gate layer, a fourth insulating layer, and a source-drain layer, wherein the active layer, the third insulating layer, the gate layer, the fourth insulating layer, and the source-drain layer are disposed in sequence;
wherein the active layer comprises a plurality of channel regions, a plurality of first doping regions and a plurality of second doping regions; the third insulating layer comprises a plurality of third via holes and a plurality of fourth via holes; the gate layer comprises a plurality of gates; the fourth insulating layer comprises a plurality of fifth via holes and a plurality of sixth via holes; the source-drain layer comprises a plurality of sources and a plurality of drains; and
wherein the plurality of sources are electrically connected to the plurality of first doping regions through the plurality of third via holes and the plurality of fifth via holes, and the plurality of drains are electrically connected to the plurality of second doping regions through the plurality of fourth via holes and the plurality of sixth via holes; the plurality of thin film transistors comprise the plurality of channel regions, the plurality of first doping regions, the plurality of second doping regions, the plurality of gates, the plurality of sources and the plurality of drains, and electrodes of the plurality of thin film transistors are the plurality of sources or the plurality of drains.

7. The array substrate of claim 6, wherein the driving array layer comprises:
a fifth insulating layer disposed on a side of the gate layer facing away from the third insulating layer, wherein the fifth insulating layer comprises a plurality of seventh via holes and a plurality of eighth via holes; wherein the plurality of sources are electrically connected to the plurality of first doping regions through the plurality of third via holes, the plurality of fifth via holes and the plurality of seventh via holes; wherein the plurality of drains are electrically connected to the plurality of second doping regions through the plurality of fourth via holes, the plurality of sixth via holes and the plurality of eighth via holes; and a storage capacitor layer disposed on a side of the fifth insulating layer facing away from the third insulating layer, wherein the storage capacitor layer comprises a plurality of capacitor electrodes.

8. A display panel, comprising:

the array substrate of claim 1 and a second electrode; and a plurality of light-emitting units disposed between the array substrate and the second electrode.

9. The display panel of claim 8, wherein the array substrate comprises a plurality of pixel circuit regions arranged in an array, and each of the plurality of pixel circuit regions comprises the plurality of thin film transistors;

wherein the array of the plurality of pixel circuit regions comprises N1 rows and M1 columns, wherein N1 and M1 are positive integers; and wherein relative positions of the plurality of first via holes in corresponding pixel circuit regions are the same.

10. The display panel of claim 9, wherein the plurality of light-emitting units are arranged in an array, and the array of the plurality of light-emitting units comprises N2 rows and M2 columns; and wherein N2 and M2 are both positive integers, N1×M1=N2×M2, N1≠N2, and M1≠M2.

11. The display panel of claim 10, wherein N2>N1;

wherein the plurality of light-emitting units comprises a plurality of first light-emitting units, a plurality of second light-emitting units and a plurality of third light-emitting units; wherein part of the plurality of first light-emitting units in a (3i+1)-th row and part of the plurality of third light-emitting units in the (3i+1)-th row are disposed at intervals; part of the plurality of second light-emitting units in a (3i+2)-th row and part of the plurality of first light-emitting units in the (3i+2)-th row are disposed at intervals; part of the plurality of third light-emitting units in a (3i+3)-th row and part of the plurality of second light-emitting units in the (3i+3)-th row are disposed at intervals; wherein i is a non-negative integer; and wherein part of the plurality of first via holes in a k-th row are electrically connected to all of the plurality of light-emitting units in a (2k−1)-th row, and the part of the plurality of first via holes in the k-th row are electrically connected to part of the plurality of light-emitting units in a 2k-th row, wherein k is a positive integer.

12. The display panel of claim 10, wherein the plurality of light-emitting units comprises a plurality of first light-emitting units, a plurality of second light-emitting units and a plurality of third light-emitting units; and wherein first via holes in a (3k+1)-th row are electrically connected to the plurality of first light-emitting units; first via holes in a (3k+2)-th row are electrically connected to the plurality of second light-emitting units; first via holes in a (3k+3)-th row are electrically connected to the plurality of third light-emitting units.

13. The display panel of claim 8, wherein the display panel is in one of an organic light-emitting diode display panel and a micro light-emitting diode display panel.

14. A display device, comprising a display panel, wherein the display panel comprises:

an array substrate and a second electrode; and a plurality of light-emitting units disposed between the array substrate and the second electrode;

wherein the array substrate comprises: a driving array layer, a first insulating layer, an auxiliary trace layer, a second insulating layer and a first electrode layer, wherein the driving array layer, the first insulating layer, the auxiliary trace layer, the second insulating layer and the first electrode layer are disposed in sequence; wherein the driving array layer comprises a plurality of thin film transistors, the first insulating layer comprises a plurality of first via holes, and the first electrode layer comprises a plurality of first electrodes; and wherein the auxiliary trace layer comprises a plurality of auxiliary traces, the plurality of auxiliary traces are in one-to-one correspondence with the plurality of first electrodes, and the plurality of auxiliary traces are electrically and correspondingly connected to electrodes of the plurality of thin film transistors through the plurality of first via holes; the second insulating layer comprises a plurality of second via holes, and the each of the plurality of auxiliary traces is electrically connected to a respective one of the plurality of first electrodes through one of the plurality of second via holes, wherein the auxiliary trace layer and a touch electrode layer are disposed on a same layer.

15. A manufacturing method of an array substrate, comprising:

forming a driving array layer, wherein the driving array layer comprises a plurality of thin film transistors;

forming a first insulating layer on the driving array layer, wherein the first insulating layer comprises a plurality of first via holes;

forming an auxiliary trace layer on a side of the first insulating layer facing away from the driving array layer, wherein the auxiliary trace layer comprises a plurality of auxiliary traces, and the plurality of auxiliary traces are electrically and correspondingly connected to electrodes of the plurality of thin film transistors through the plurality of first via holes;

forming a second insulating layer on a side of the auxiliary trace layer facing away from the driving array layer, wherein the second insulating layer comprises a plurality of second via holes; and forming a first electrode layer on a side of the second insulating layer facing away from the driving array layer, wherein the first electrode layer comprises a plurality of first electrodes, the plurality of first electrodes are in one-to-one correspondence with the plurality of auxiliary traces, and each of the plurality of first electrodes is electrically connected to a respective one of the plurality of auxiliary traces through one of the second via holes, wherein the auxiliary trace layer and a touch electrode layer are disposed on a same layer.

16. The manufacturing method of an array substrate of claim 15, after forming the first electrode layer, further comprising:

forming a pixel defining layer on a side of the first electrode layer facing away from the driving array layer, wherein the pixel defining layer comprises a plurality of light-emitting openings, and the plurality of light-emitting openings do not overlap with the plurality of second via holes in a direction perpendicular to the driving array layer.

17. The manufacturing method of an array substrate of claim 15, wherein a material of the first insulating layer comprises at least one of silicon oxide and silicon nitride.

18. The manufacturing method of an array substrate of claim 17, wherein forming the first insulating layer comprises:
    sequentially forming a first insulating structure layer and a second insulating structure layer, wherein a material of the first insulating structural layer is silicon oxide, and a material of the second insulating structural layer is silicon nitride.

* * * * *